United States Patent

Hashimoto et al.

Patent Number: 6,077,596
Date of Patent: Jun. 20, 2000

[54] COATED HARD TOOL HAVING MULTI-LAYER COATING

[75] Inventors: Yasuhisa Hashimoto; Kazuo Yamagata; Nobuyuki Kitagawa, all of Itami, Japan

[73] Assignee: Sumitomo Electric Industries, Ltd., Osaka, Japan

[21] Appl. No.: 09/094,418

[22] Filed: Jun. 9, 1998

[30] Foreign Application Priority Data

Jun. 19, 1997 [JP] Japan ................................. 9-162151

[51] Int. Cl.[7] .................... B32B 9/00; B32B 7/02
[52] U.S. Cl. ................ 428/216; 428/212; 428/336; 428/469; 428/472; 428/697; 428/698; 428/699; 428/701; 428/702; 51/307; 51/309
[58] Field of Search ........................ 428/216, 212, 428/336, 698, 657, 699, 701, 702, 457, 465, 472; 51/307, 309

[56] References Cited

U.S. PATENT DOCUMENTS

| | | | |
|---|---|---|---|
| 4,554,201 | 11/1985 | Andreev et al. | 428/215 |
| 4,599,281 | 7/1986 | Schintlmeister et al. | 428/699 |
| 4,643,951 | 2/1987 | Keem et al. | 428/469 |
| 4,753,854 | 6/1988 | Gavrilove et al. | 428/698 |
| 4,776,863 | 10/1988 | Van Den Berg et al. | 51/295 |
| 4,835,062 | 5/1989 | Holleck | 428/469 |
| 4,895,770 | 1/1990 | Schintlmeister et al. | 428/552 |
| 5,503,912 | 4/1996 | Setoyama et al. | 428/216 |
| 5,783,295 | 7/1998 | Barnett et al. | 428/216 |

FOREIGN PATENT DOCUMENTS

| | | |
|---|---|---|
| 0 446 375 | 9/1991 | European Pat. Off. |
| 8-127862 | 5/1996 | Japan |

*Primary Examiner*—A. A. Turner
*Attorney, Agent, or Firm*—W. F. Fasse; W. G. Fasse

[57] ABSTRACT

In a coated hard tool, a hard coating is formed on a hard base material, wherein the coating includes ten or more sublayers of types A and B stacked alternately. In the sublayer of type A, a plurality of secondary sublayers of different types each having a thickness of 1 to 50 nm are stacked periodically and repeatedly, while the sublayer of type B is formed of a single layer. The sublayers each have a thickness of 100 to 1000 nm. Each sublayer contains at least one compound selected from a nitride, a carbide, a nitrided carbide and an oxide containing at least one element selected from elements of periodic group 4A, elements of periodic group 5A, Al and B.

20 Claims, 3 Drawing Sheets

COATED HARD TOOL HAVING MULTI-LAYER COATING

BACKGROUND OF THE INVENTION

1. Field of the Invention

The present invention relates to a coated hard tool used as a cutting tool requiring wear resistance, or other wear resistant tool. More specifically, the present invention relates to an improvement of wear resistance and seizure resistance of the tool.

2. Description of the Background Art

Conventionally, a super hard alloy has been used for a cutting tool. Such a super hard alloy may include a WC—Co alloy to which a carbide, a nitride, a nitrided carbide or the like of Ti, Ta, Nb or the like are added, for example.

Recently, as the speed of cutting increases, a type of coated hard tool has come to be frequently used, in which a hard coating having a thickness of about 3 to about 20 $\mu$m is formed by PVD (Physical Vapor Deposition) on a surface of a hard base material such as a super hard alloy, a cermet, an alumina based ceramic, a silicon nitride based ceramic or the like. A film containing a carbide, a nitride, a nitrided carbide, a nitrided boride or an oxide of an element in group 4A, 5A or 6A of the periodic table or of Al may be used as the hard coating. The hard coating deposited by the PVD method improves the wear resistance of the base material while not deteriorating the strength of the base material. Therefore, the hard coating is widely used for cutting tools which require strength, such as drills, end mills and throwaway tips (exchangeable, disposable tips) for milling.

Japanese Patent Laying-Open No. 8-127862 discloses a coated hard tool including a hard coating of multi-layered structure. FIG. 3 is a schematic cross section of a part of the coated hard tool containing such a multi-layered hard coating. The coated hard tool of FIG. 3 includes a hard coating 2' deposited on a hard base material 1'. In the hard coating 2', a plurality of layers of two or more types are repeatedly stacked periodically, with each layer having a thickness in the range of about 1 to about 100 nm. Each layer included in the hard coating 2' may include one or more compounds selected from a nitride, a carbide, a nitrided carbide and an oxide containing at least one element selected from periodic group 4A elements, periodic group 5A elements, Al, B and the like.

In the hard coating 2', adjacent layers of different types have crystal lattice constants that are slightly different from each other, and include a crystal lattice structure partially continuing at interfaces therebetween. In such a multi-layered film including crystal lattice structure partially continuing at the interfaces between the layers, considerable internal strain is generated by an elastic complementary effect between the layers, and as a result, a greater hardness than the inherent hardness of each single layer is obtained.

FIG. 4 is a schematic cross section of another example of a coated hard tool including a hard coating of multi-layered structure. The coated hard tool of FIG. 4 is similar to that of FIG. 3, except that an intermediate layer 3' is interposed between hard base material 1' and multi-layered coating 2' in FIG. 4. Intermediate layer 3' is provided to improve adhesion between hard base material 1' and multi-layered coating 2'. A nitride, a carbide, a nitrided carbide or the like of periodic group 4A element may be used as the intermediate layer 3'.

As described above, very high hardness is obtained because of interaction between layers in such a multi-layered coating 2' as shown in FIG. 3 or FIG. 4. However, unless strain matching between layers is stabilized appropriately, the coating 2' may be subjected to embrittlement because of too high an internal stress. Particularly, the internal strain increases as the thickness of multi-layered coating 2' increases. Therefore, when the coating is too thick, coating 2' may suffer from brittle fracture because of shock experienced during cutting.

SUMMARY OF THE INVENTION

In view of the problems of the prior art, an object of the present invention is to provide a coated hard tool having superior wear resistance and superior seizure resistance, by improving characteristics of a hard multi-layered coating.

The coated hard tool in accordance with the present invention includes a hard base material and a hard coating layer formed on a surface of the base material. The coating layer includes a plurality of sublayers of types A and B. On the surface of the base material, starting from type A or type B, a total of at least four, but preferably ten or more sublayers are stacked with the types A and B alternating with each other. The sublayer of type A has a thickness within a range of 100 to 5000 nm, and includes a plurality of types of secondary sublayers stacked in a periodically repeated manner. Each secondary sublayer of each type includes at least one compound selected from a nitride, a carbide, a nitrided carbide and an oxide including at least one element selected from periodic group 4A elements, periodic group 5A elements, Al and B, and has a thickness within the range of 1 to 50 nm. The sublayer of type B is formed of a single layer containing one or more compounds selected from a nitride, a carbide, a nitrided carbide and an oxide including at least one element selected from periodic group 4A elements, periodic group 5A elements, Al and B, and has a thickness in the range of 100 to 5000 nm.

It is preferred in the coated hard tool in accordance with the present invention, that the coating layer as a whole has a thickness of 0.5 to 10 $\mu$m.

Preferably, the coated hard tool in accordance with the present invention further includes an intermediate layer additionally interposed at an interface between the surface of the base material and the sublayer, which intermediate layer includes one compound selected from a nitride, a carbide, a nitrided carbide and an oxide of a periodic group 4A element and has a thickness of 0.5 to 10 $\mu$m. More preferably, the coating layer and the intermediate layer have a thickness of 1 to 14 $\mu$m in total.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
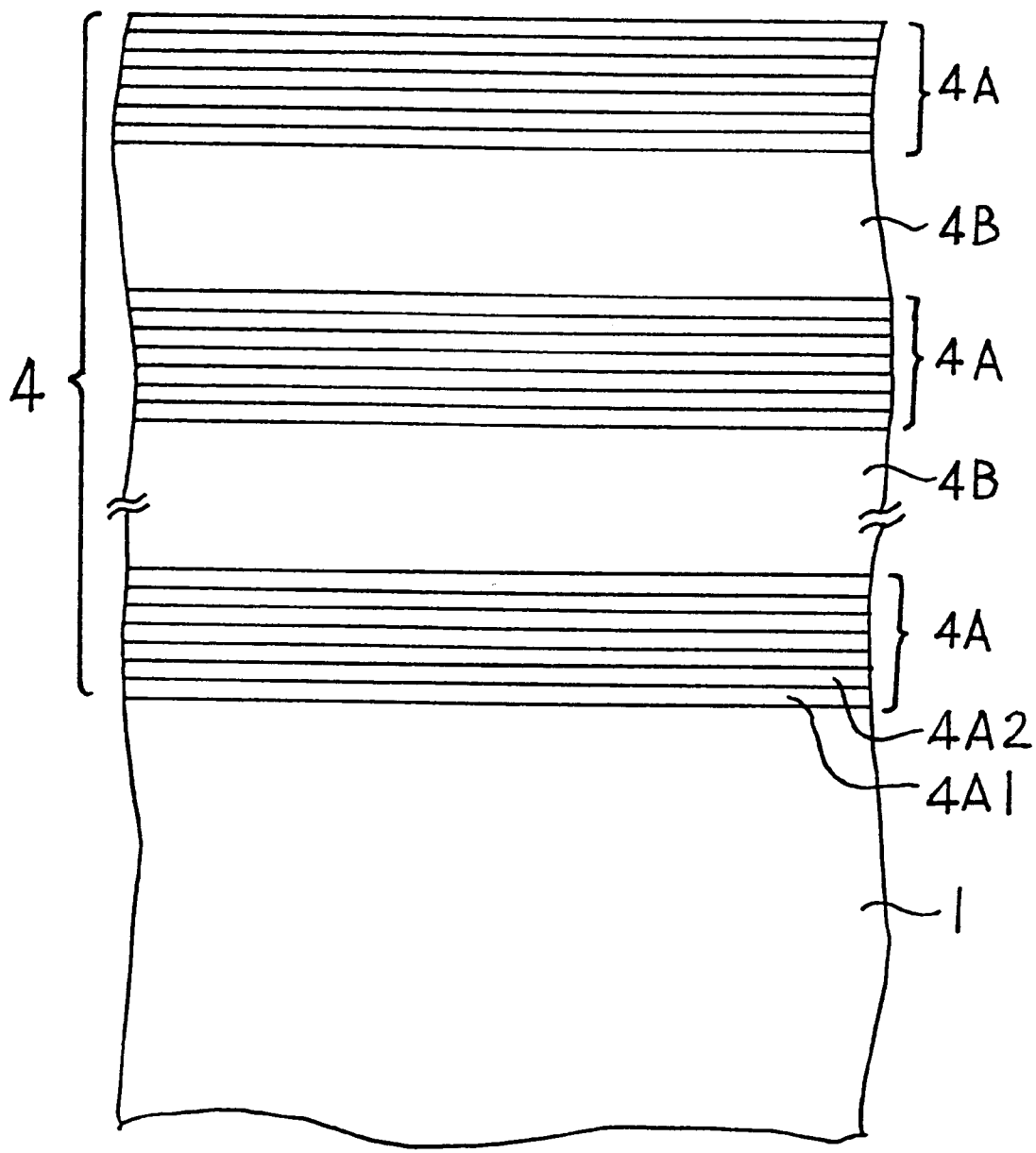
FIG. 1 is a schematic cross section of a part of a coated hard tool in accordance with one embodiment of the present invention.

FIG. 1 schematically shows a cross section of a part of the coated hard tool in accordance with one example of the present invention. The coated hard tool includes a hard coating layer 4 stacked on a hard base material 1. Coating layer 4 includes a plurality of sublayers 4A of type A, as well as a plurality of sublayers 4B of type B. The sublayers 4A and 4B of types A and B respectively are stacked alternately on the surface of base material 1, to provide a total of at least ten layers. The alternate repeated stacked layers are shown as starting from sublayer 4A of type A in FIG. 1. However, the stacking may start from sublayer 4B of type B.

Sublayer 4A of type A has a thickness in the range of 100 to 5000 nm, and includes a plurality of secondary sublayers 4A1, 4A2, etc. of two or more types successively stacked periodically and repeatedly. Each of the secondary sublayers may include at least one compound selected from a nitride, a carbide, a nitrided carbide and an oxide including at least one element selected from periodic group 4A elements, periodic group 5A elements, Al and B, and preferably has a thickness in the range of about 1 to about 50 nm.

By contrast, sublayer 4B of type B is formed of a single layer. Sublayer 4B may include at least one compound selected from a nitride, a carbide, a nitrided carbide and an oxide including at least one element selected from periodic group 4A elements, periodic group 5A elements, Al and B, and preferably its thickness is in the range of about 100 to about 5000 nm.

It is preferred that the thickness of hard coating layer 4 as a whole is within the range of about 0.5 to about 10 μm. When the thickness of coating layer 4 is smaller than 0.5 μm, a sufficient improvement in wear resistance is not ensured, and when the thickness exceeds 10 μm, the coating layer 4 tends to be abraded.

The inventors have found that the coated hard tool such as shown in FIG. 1 has a stable and superior wear resistance and seizure resistance. As described with reference to the prior art, sublayer 4A of type A exhibits an extremely high hardness because of interaction between each of the plurality of very thin secondary sublayers 4A1, 4A2, etc. included therein. However, the thickness of each sublayer 4A is limited to at most 5000 nm, and hence the internal strain in each sublayer 4A does not become extremely high. Further, sublayer 4B, which is a single layer with large thickness inserted between the plurality of sublayers 4A, functions to relax the internal strain in sublayer 4A. As a result, the coating layer 4 of the coated hard tool shown in FIG. 1 achieves a high hardness without embrittlement, enabling stable and superior wear resistance and seizure resistance.

Figure 2:
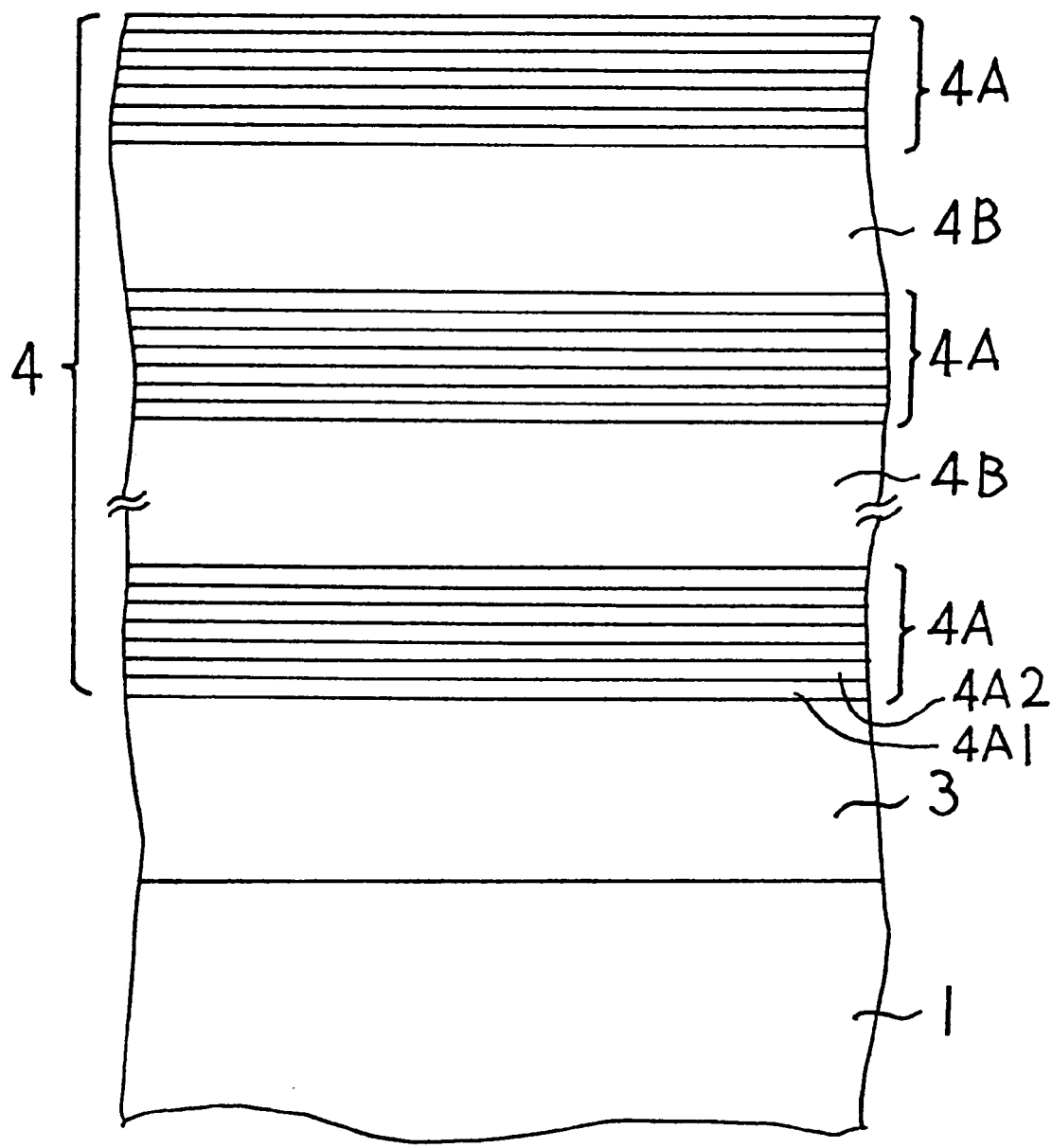
FIG. 2 is a schematic cross section of a part of the coated hard tool in accordance with another embodiment of the present invention.

FIG. 2 schematically shows a cross section of a part of a coated hard tool in accordance with another example of the present invention. Though the coated hard tool of FIG. 2 is generally similar to that of FIG. 1 and a redundant description is omitted, in the example of FIG. 2 an intermediate layer 3 consisting of a single layer is inserted between hard base material 1 and hard coating layer 4 which includes sublayers 4A and 4B of types A and B respectively. Intermediate layer 3 may include a compound selected from a nitride, a carbide, a nitrided carbide and an oxide of periodic group 4A elements, and it has a thickness respectively greater than both sublayers 4A and 4B of types A and B. Preferably, the thickness is in the range of about 0.5 to about 2 μm.

Such a thick intermediate layer 3 improves the adhesion between coating layer 4 and base material 1, and in addition, it functions to relax the internal strain of coating layer 4 as a whole. Therefore, when intermediate layer 3 is provided, the thickness of coating layer 4 can be increased to some extent, and it is preferred that the total thickness of inter-mediate layer 3 and coating layer 4 is within the range of about 1 to about 14 μm.

Each sublayer of hard coating layer 4, and intermediate layer 3 as described above may be deposited by an ordinary PVD method. However, deposition by arc ion plating or sputtering is more preferable.

Figure 3:
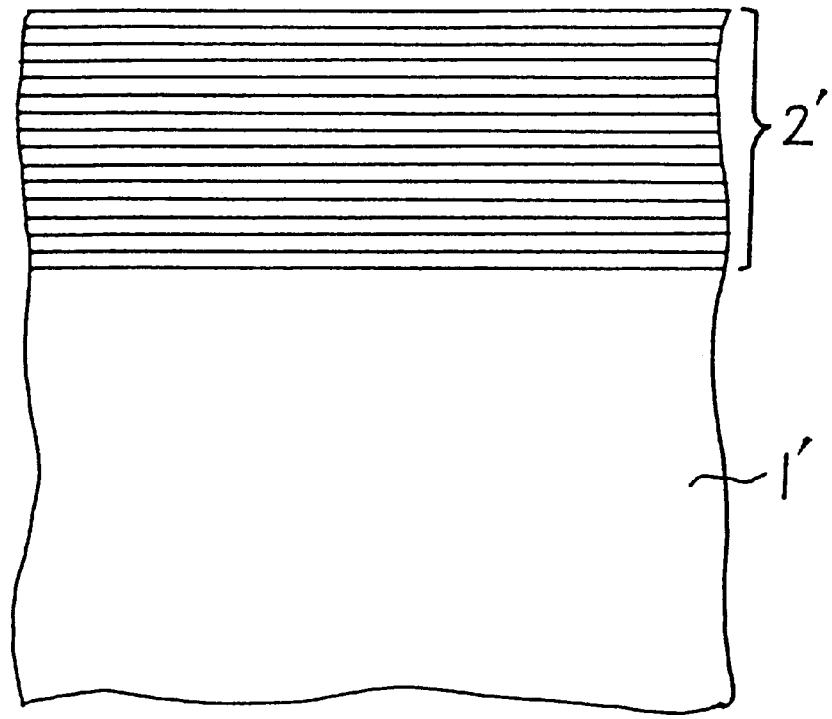
FIG. 3 is a schematic cross section of a part of a hard tool in accordance with a prior art example.

Table 1 shows samples A1 to A7 of the present invention corresponding to FIG. 1, and comparative samples B1 to B7 corresponding to the prior art of FIG. 3. In all of the coated hard tools in accordance with the samples of the present invention and the comparative samples, a super hard alloy of ISO-P30 having the shape designated as SDKN42MT was used as base material 1, and various hard coating layers were deposited by arc ion plating.

TABLE 1

Samples of the Invention

| No. | Layer 4 | Layer 4A | Layer 4B | Amount of Wear |
|---|---|---|---|---|
| A1 | 4 μm | TiN: 1 nm<br>AlN: 1 nm<br>Total: 500 nm | TiN 500 nm | 0.115 mm |
| A2 | 10.2 μm | TiN: 50 nm<br>A1N: 50 nm<br>Total: 5000 nm | TiN 100 nm | 0.122 mm |
| A3 | 3.1 μm | HfC: 20 nm<br>NbO: 20 nm<br>Total: 120 nm | TiC 500 nm | 0.232 mm |
| A4 | 10.2 μm | ZrCN: 5 nm<br>TaN: 5 nm<br>Total: 120 nm | SiC 5000 nm | 0.265 mm |
| A5 | 6 μm | VN: 8 nm<br>BN: 8 nm<br>Total: 1000 nm | TiC 200 nm | 0.264 mm |
| A6 | 1 μm | $Al_2O_3$: 1 nm<br>TiCN: 1 nm<br>Total: 100 nm | TaCN 100 nm | 0.245 mm |
| A7 | 2 μm | TiAlN: 2 nm<br>TiN: 2 nm<br>Total: 150 nm | TiN 150 nm | 0.154 mm |

Comparative Samples

| No. | Layer 2' | Sublayer | Amount of Wear |
|---|---|---|---|
| B1 | 4 μm | TiN: 1 nm<br>AlN: 1 nm | 0.444 mm |
| B2 | 10.2 μm | TiN: 50 nm<br>A1N: 50 nm | 0.325 mm |
| B3 | 3.1 μm | HfC: 20 nm<br>NbO: 20 nm | 0.432 mm |
| B4 | 10.2 μm | ZrCN: 5 nm<br>TaN: 5 nm | 0.369 mm |
| B5 | 6 μm | VN: 8 nm<br>BN: 8 nm | 0.367 mm |
| B6 | 1 μm | $Al_2O_3$: 1 nm<br>TiCN: 1 nm | 0.301 mm |
| B7 | 2 μm | TiAlN: 2 nm<br>TiN: 2 nm | 0.258 mm |

Referring to Table 1, in sample A1 of the present invention, coating layer 4 having an entire or total thickness of 4 μm is deposited on base material 1. Sublayer 4A contained in coating layer 4 has a thickness of 500 nm as a whole, in which a sublayer 4a1 of TiN having a thickness of 1 nm and a sublayer 4a2 of AlN having a thickness of 1 nm are stacked alternately and repeatedly. Another sublayer 4B contained in coating layer 4 is formed of a single layer of TiN and has a thickness of 500 nm.

In comparative sample B1 which is to be compared with sample A1 of the present invention, coating layer 2' has a thickness of 4 μm, similar to coating layer 4 of sample A1 of the present invention. However, the comparative sample does not contain any sublayer which corresponds to the sublayer 4B. More specifically, coating layer 2' of comparative sample B1 simply includes a sublayer of TiN having a thickness of 1 nm and a sublayer of Al having a thickness of 1 nm stacked alternately and repeatedly to a large number. This corresponds to the single sublayer 4A of sample A1 of the present invention with the thickness increased.

As for samples A2 to A7 of the present invention and corresponding comparative samples B2 to B7, these have respective thicknesses and compositions as shown in Table 1, similar to the case of sample A1 and comparative sample B1.

Using the samples of the present invention and comparative samples shown in Table 1 as cutting tips, a cutting test of cutting alloyed steel blocks was performed under the following conditions, and a resulting flank wear amount of each sample was measured.

Conditions of Cutting Test

Cut material: SCM435 (hardness: HB250)

Method of cutting: milling

Manner of cutting: dry

Speed of cutting: 200 m/min

Depth of cutting: 1.5 mm

Feed of milling: 0.25 mm/blade

Cutting length: 2 m

Table 1 also shows the flank wear amount measured for each sample, as a result of the cutting test described above. As is apparent from comparison of the flank wear amounts of samples A1 to A7 and comparative samples B1 to B7 in Table 1, samples of the present invention have a stable wear resistance and hence the amount of wear is remarkably reduced, as compared with the comparative samples.

TABLE 2

Samples of the Invention

| No. | Layer 4 | Layer 4A | Layer 4B | Intermediate Layer | Amount of Wear |
|---|---|---|---|---|---|
| C1 | 4 μm | TiN: 1 nm<br>AlN: 1 nm<br>Total: 500 nm | TiN<br>500 nm | TiN 1 μm | 0.032 mm |
| C2 | 10.2 μm | TiN: 50 nm<br>AlN: 50 nm<br>Total: 5000 nm | TiN<br>100nm | TiN 1 μm | 0.045 mm |
| C3 | 3.1 μm | HfC: 20 nm<br>NbO: 20 nm<br>Total: 120 nm | TiC<br>500 nm | HfO 0.5 μm | 0.125 mm |
| C4 | 10.2 μm | ZrCN: 5 nm<br>TaN: 5 nm<br>Total: 120 nm | SiC<br>5000 nm | TiCN 0.5 μm | 0.135 mm |
| C5 | 6 μm | VN: 8 nm<br>BN: 8 nm<br>Total: 1000 nm | TiC<br>200 nm | TiZrN 2 μm | 0.119 mm |
| C6 | 1 μm | Al$_2$O$_3$: 1 nm<br>TiCN: 1 nm<br>Total: 100 nm | TaCN<br>100 nm | TaC 0.5 μm | 0.125 mm |
| C7 | 2 μm | TiAlN: 2 nm<br>TiN: 2 nm<br>Total: 150 nm | TiN<br>150 nm | TiN 0.5 μm | 0.098 mm |

Comparative Samples

| No. | Layer 2 | Sublayer | Intermediate Layer | Amount of Wear |
|---|---|---|---|---|
| D1 | 4 μm | TiN: 1 nm<br>AlN: 1 nm | TiN 1 μm | 0.325 mm |
| D2 | 10.2 μm | TiN: 50 nm<br>AlN: 50 nm | TiN 1 μm | 0.225 mm |
| D3 | 3.1 μm | HfC: 20 nm<br>NbO: 20 nm | HfO 0.5 μm | 0.398 mm |
| D4 | 10.2 μm | ZrCN: 5 nm<br>TaN: 5 nm | TiCN 0.5 μm | 0.321 mm |
| D5 | 6 μm | VN: 8 nm<br>BN: 8 nm | TiZrN 2 μm | 0.310 mm |
| D6 | 1 μm | Al$_2$O$_3$: 1 nm<br>TiCN: 1 nm | TaC 0.5 μm | 0.299 mm |
| D7 | 2 μm | TiAlN: 2 nm<br>TiN: 2 nm | TiN 0.5 μm | 0.248 mm |

Figure 4:
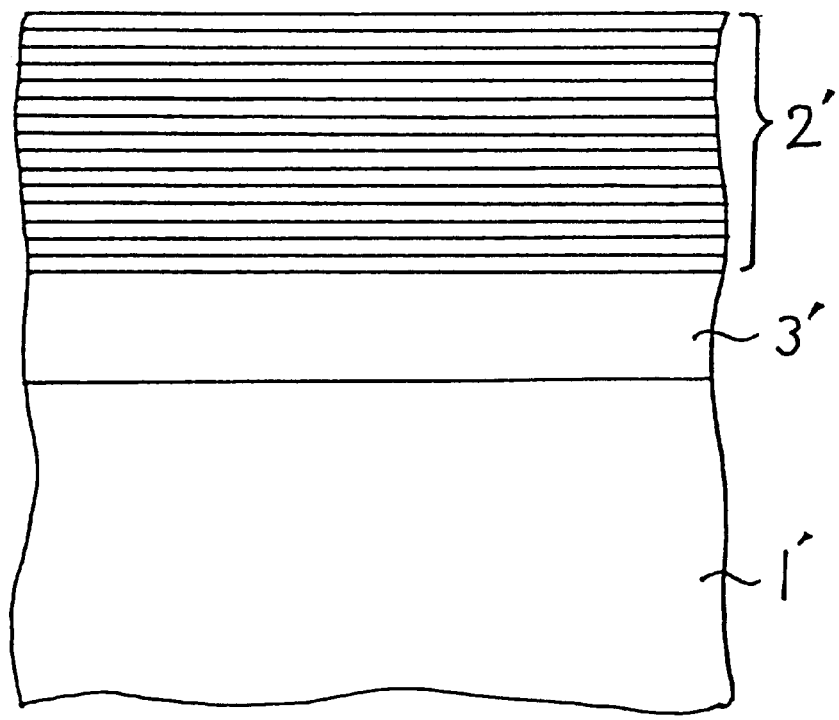
FIG. 4 is a schematic cross section of a part of a coated hard tool in accordance with another prior art example.

Table 2 shows inventive sample numbers C1 to C7 corresponding to FIG. 2, and comparative sample numbers D1 to D7 corresponding to the prior art of FIG. 4. Though sample C1 of the present invention shown in Table 2 is otherwise similar to sample A1 of Table 1, it additionally includes an intermediate layer 3 having a thickness of 1 μm and formed of TiN. Similarly, samples C2 to C7 of the present invention shown in Table 2 are otherwise similar to samples A2 to A7 of Table 1, and additionally include intermediate layers as shown in Table 2. Comparative samples D1 to D7 of Table 2 are otherwise similar to comparative samples B1 to B7 of Table 1, and additionally include intermediate layers as shown in Table 2.

A similar cutting test as that performed with the samples of Table 1 was performed using the samples of the present invention and the comparative samples shown in Table 2. Table 2 also shows the flank wear amount of each sample measured as a result of the test. As is apparent from comparison of the respective flank wear amount of samples C1 to C7 of the present invention and of comparative samples D1 to D7 of Table 2, the samples of the present invention have a stable wear resistance and the amount of wear is remarkably reduced, as compared with the comparative samples. As is apparent from comparison between samples A1 to A7 of the present invention shown in Table 1 which do not include any intermediate layer and samples C1 to C7 of the present invention shown in Table 2 having intermediate layers, the samples of the invention with intermediate layers have a further stabilized wear resistance and hence the amount of wear is further reduced, as compared with samples of the invention not including any intermediate layer.

As described above, in the coated hard tool of the present invention, the wear resistance of the surface layer is stabilized, the amount of wear is remarkably reduced and hence the life of the tool can be made longer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A coated hard tool including a hard base material and a hard coating on a surface of said base material, wherein
   said coating includes a total of at least four type A sublayers and type B sublayers stacked alternately starting with a type A sublayer or a type B sublayer at least indirectly on said surface of said base material,
   said type A sublayer has a thickness in a range of 100 to 5000 nm, and includes a plurality of at least first secondary sublayers and second secondary sublayers successively stacked periodically and repeatedly with each other, wherein said first secondary sublayers respectively have a first composition including at least one compound selected from a nitride, a carbide, a nitrided carbide and an oxide containing at least one element selected from periodic group 4A elements, periodic group 5A elements, Al and B, wherein said second secondary sublayers respectively have a second composition different from said first composition and including at least one compound selected from a nitride, a carbide, a nitrided carbide and an oxide containing at least one element selected from periodic group 4A elements, periodic group 5A elements, Al and B, and wherein each said secondary sublayer has a thickness in a range of 1 to 50 nm, said type B sublayer consists of a single layer containing at least one compound selected from a nitride, a carbide, a nitrided carbide and an oxide containing at least one element selected from periodic group 4A elements, periodic group 5A elements, Al and B, and having a thickness in a range of 100 to 5000 nm.

2. The coated hard tool according to claim 1, wherein said coating as a whole has a total thickness in a range of 0.5 to 10 $\mu$m.

3. The coated hard tool according to claim 1, further comprising an intermediate layer interposed between said surface of said base material and said coating, wherein said intermediate layer contains a compound selected from a nitride, a carbide, a nitrided carbide and an oxide of a periodic group 4A element, and has a thickness in a range of 0.5 to 10 $\mu$m, and wherein said coating and said intermediate layer together have a total thickness in a range of 1 to 14 $\mu$m.

4. The coated hard tool according to claim 3, wherein said intermediate layer consists essentially of a single layer of one of TiN, TiCN, TiZrN, TaC, and HfO.

5. The coated hard tool according to claim 4, wherein said type B sublayer consists essentially of one of TiN, TiC, TaCN and SiC, and said first and second secondary sublayers of said type A sublayer respectively consist essentially of combinations of compounds selected from TiN/AlN, TiN/TiAlN, TiCN/Al$_2$O$_3$, HfC/NbO, ZrCN/TaN and VN/BN.

6. The coated hard tool according to claim 3, wherein said thickness of said intermediate layer is not less than said thickness of said type A sublayer and is not less than said thickness of said type B sublayer.

7. The coated hard tool according to claim 3, wherein said thickness of said intermediate layer is at least 1 $\mu$m.

8. The coated hard tool according to claim 3, wherein said thickness of said intermediate layer is not greater than 2 $\mu$m.

9. The coated hard tool according to claim 1, wherein said coating is arranged directly on and in contact with said surface of said base material.

10. The coated hard tool according to claim 1, wherein said coating consists of said type A sublayers and said type B sublayers.

11. The coated hard tool according to claim 10, wherein each one of said type A sublayers consists of said first secondary sublayers and said second secondary sublayers.

12. The coated hard tool according to claim 1, wherein said type B sublayer consists essentially of one of TiN, TiC, TaCN and SiC, and said first and second secondary sublayers of said type A sublayer respectively consist essentially of combinations of compounds selected from TiN/AlN, TiN/TiAlN, TiCN/Al$_2$O$_3$, HfC/NbO, ZrCN/TaN and VN/BN.

13. The coated hard tool according to claim 1, wherein said hard base material comprises one of a cermet, an alumina based ceramic, a silicon nitride based ceramic, and a superhard alloy selected from a WC—Co alloy, and a WC—Co alloy containing WC, Co, and at least one of a carbide, a nitride, and a nitrided carbide of at least one of Ti, Ta, and Nb.

14. The coated hard tool according to claim 1, wherein said coating includes at least 8 of said type A and type B sublayers.

15. The coated hard tool according to claim 1, wherein said coating includes at least 10 of said type A and type B sublayers.

16. The coated hard tool according to claim 1, wherein said coating includes at least 13 of said type A and type B sublayers.

17. The coated hard tool according to claim 1, wherein each said type A sublayer includes at least 24 of said first and second secondary sublayers.

18. The coated hard tool according to claim 1, wherein each said type A sublayer includes at least 75 of said first and second secondary sublayers.

19. The coated hard tool according to claim 1, wherein each said type A sublayer includes at least 100 of said first and second secondary sublayers.

20. The coated hard tool according to claim 1, wherein said thickness of each said secondary sublayer is greater than 20 nm.

* * * * *